United States Patent
Strogies et al.

(10) Patent No.: US 10,004,147 B2
(45) Date of Patent: Jun. 19, 2018

(54) METHOD FOR THE DIFFUSION SOLDERING OF AN ELECTRONIC COMPONENT TO A SUBSTRATE

(71) Applicant: Siemens Aktiengesellschaft, Munich (DE)

(72) Inventors: Joerg Strogies, Berlin (DE); Klaus Wilke, Berlin (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 38 days.

(21) Appl. No.: 15/025,515

(22) PCT Filed: Sep. 11, 2014

(86) PCT No.: PCT/EP2014/069368
§ 371 (c)(1),
(2) Date: Mar. 28, 2016

(87) PCT Pub. No.: WO2015/043969
PCT Pub. Date: Apr. 2, 2015

(65) Prior Publication Data
US 2016/0219720 A1    Jul. 28, 2016

(30) Foreign Application Priority Data

Sep. 27, 2013   (DE) .......................... 10 2013 219 642

(51) Int. Cl.
*H05K 3/34* (2006.01)
*H01L 23/00* (2006.01)
(Continued)

(52) U.S. Cl.
CPC ............. *H05K 3/341* (2013.01); *H01L 24/05* (2013.01); *H01L 24/29* (2013.01); *H01L 24/30* (2013.01);
(Continued)

(58) Field of Classification Search
CPC ......... H01L 24/05; H01L 24/29; H01L 24/30; H01L 24/32; H01L 24/33; H01L 24/83; H05K 1/11; H05K 1/181; H05K 3/341
See application file for complete search history.

(56) References Cited

U.S. PATENT DOCUMENTS

| 5,483,092 A | 1/1996 | Kosaki .......................... 257/276 |
| 6,399,182 B1 | 6/2002 | Rubel et al. ................... 428/167 |

(Continued)

FOREIGN PATENT DOCUMENTS

| DE | 69428378 T2 | 7/2002 | |
| DE | 102004058878 A1 | 6/2006 | ............. H01L 21/58 |

(Continued)

OTHER PUBLICATIONS

Li, Mei et al., "Thermodynamic Optimation of the Cu-Sn and Cu-Nb-Sn Systems," Journal of Alloys and Compounds, vol. 477, No. 1-2, pp. 104-117 (14 pages), Nov. 17, 2008.

(Continued)

*Primary Examiner* — Paul D Kim
(74) *Attorney, Agent, or Firm* — Slayden Grubert Beard PLLC (57) ABSTRACT

A diffusion soldering method for joining an electronic component to a substrate is provided. The joining surfaces are designed such that cavities are formed in a joining gap between the component and substrate. The formation of such cavities can be provided, e.g., by depressions in a mounting surface of the component and/or in a contact surface of the substrate, the depressions being cup-shaped and/or defining channels that surround columnar structural elements, the end faces of which define the mounting surface and/or contact surface. The cavities are designed such that solder material can leak into the cavities when the component during a heating process to achieve a desired width of the joining gap. This allows for the formation of a narrow-width joining (Continued)

having a diffusion zone that bridges the joining gap upon soldering. In this manner, a diffusion solder connection can be produced even using standard solder.

9 Claims, 4 Drawing Sheets (51) Int. Cl.
H05K 1/11 (2006.01)
H05K 1/18 (2006.01)
(52) U.S. Cl.
CPC .............. *H01L 24/32* (2013.01); *H01L 24/33* (2013.01); *H01L 24/83* (2013.01); *H05K 1/11* (2013.01); *H05K 1/181* (2013.01); *H01L 2224/04026* (2013.01); *H01L 2224/05552* (2013.01); *H01L 2224/05557* (2013.01); *H01L 2224/05647* (2013.01); *H01L 2224/291* (2013.01); *H01L 2224/29011* (2013.01); *H01L 2224/29034* (2013.01); *H01L 2224/29111* (2013.01); *H01L 2224/3003* (2013.01); *H01L 2224/3011* (2013.01); *H01L 2224/30131* (2013.01); *H01L 2224/30134* (2013.01); *H01L 2224/30177* (2013.01); *H01L 2224/3201* (2013.01); *H01L 2224/32058* (2013.01); *H01L 2224/32059* (2013.01); *H01L 2224/32221* (2013.01); *H01L 2224/32503* (2013.01); *H01L 2224/33107* (2013.01); *H01L 2224/8381* (2013.01); *H01L 2224/83385* (2013.01); *H01L 2224/83447* (2013.01); *H01L 2224/83815* (2013.01); *H01L 2224/83825* (2013.01)

(56) References Cited

U.S. PATENT DOCUMENTS

| | | | |
|---|---|---|---|
| 6,406,636 B1 | 6/2002 | Vaganov ........................... 216/2 |
| 6,670,222 B1 | 12/2003 | Brodsky ....................... 438/118 |
| 6,673,189 B2 | 1/2004 | Gerss et al. .................. 156/276 |
| 7,309,924 B2* | 12/2007 | Song ...................... H01L 23/13 257/778 |
| 7,528,061 B2* | 5/2009 | Syllaios ............... B23K 1/0016 438/612 |
| 8,736,052 B2 | 5/2014 | Oeschler et al. ............. 257/738 |
| 8,987,879 B2 | 3/2015 | Otremba ....................... 257/676 |
| 9,437,520 B2* | 9/2016 | Orimoto ............ H01L 23/3675 |
| 2007/0114662 A1 | 5/2007 | Helneder et al. ............. 257/737 |
| 2007/0278511 A1* | 12/2007 | Ohno ..................... H01L 24/32 257/99 |
| 2007/0278700 A1* | 12/2007 | St. Germain ....... H01L 23/3107 257/782 |
| 2009/0224279 A1* | 9/2009 | Shimokawa ........... H01L 24/32 257/99 |
| 2011/0000894 A1 | 1/2011 | Ishida et al. ............. 219/121.43 |
| 2012/0306087 A1 | 12/2012 | Bayerer et al. ............... 257/772 |
| 2014/0225274 A1 | 8/2014 | Guyenot et al. .............. 257/774 |

FOREIGN PATENT DOCUMENTS

| | | | | |
|---|---|---|---|---|
| DE | 102005055280 B3 | 4/2007 | | |
| DE | 102012105929 A1 | 1/2013 | ............ H01L 21/60 |
| DE | 102012214901 A1 | 2/2013 | ............ H01L 21/58 |
| EP | 1450402 A1 | 8/2004 | | |
| EP | 1498208 A1 | 1/2005 | ............... B23K 1/00 |
| JP | 5968935 A | 4/1984 | ............ H01L 21/52 |
| JP | 6164132 A | 4/1986 | ............ H01L 21/52 |
| JP | 0738208 A | 2/1995 | | |
| JP | 2007110001 A | 4/2007 | ............ H01L 21/52 |
| WO | 2006/060981 A1 | 6/2006 | ............ H01L 21/60 |
| WO | 2013/004543 A1 | 1/2013 | | |
| WO | 2015/043969 A2 | 4/2015 | ............ H01L 21/60 |

OTHER PUBLICATIONS

Anonymous, "Lot (Metal)," Wikipedia, URL: http://de.wikipedia.org/w/index.php?title=Lot_(Metall)&oldid=122411715, German language w/ English translation, 18 pages, 2013.
German Office Action, Application No. 102013219642.3, 5 pages, dated Mar. 19, 2014.
International Search Report and Written Opinion, Application No. PCT/EP2014/069368, 43 pages, dated May 13, 2015.
Chinese Office Action, Application No. 201480053472.1, 8 pages, dated Oct. 30, 2017.
European Office Action, Application No. 14771823.3, 14 pages, dated Apr. 11, 2018.

* cited by examiner

METHOD FOR THE DIFFUSION SOLDERING OF AN ELECTRONIC COMPONENT TO A SUBSTRATE

CROSS-REFERENCE TO RELATED APPLICATIONS

This application is a U.S. National Stage Application of International Application No. PCT/EP2014/069368 filed Sep. 11, 2014, which designates the United States of America, and claims priority to DE Application No. 10 2013 219 642.3 filed Sep. 27, 2013, the contents of which are hereby incorporated by reference in their entirety

TECHNICAL FIELD

The invention relates to a method for the diffusion soldering of an electronic component to a substrate. In said method, the component is placed with its mounting surface on to a contact surface of the substrate, wherein a solder material is used between the substrate and the component. Then, the solder material is heated to a temperature which initiates a diffusion process between the solder material and the component and between the solder material and the substrate, wherein the soldered connection is formed. Here, chemical elements diffuse out of the component and out of the substrate into the soldered connection that forms, wherein the chemical composition in said soldered connection changes. Specifically, the chemical elements diffuse out of the metallic coatings provided for this purpose into the soldered connection. Said metallic coatings on the component and on the substrate are, within the context of this invention, regarded as being parts of the component and of the substrate.

The solder material may be liquefied, because in this way, the diffusion processes in the solder material can be greatly accelerated. Furthermore, it is then also the case that a temperature prevails which is high enough that the diffusion processes in the component and in the substrate can be initiated. Specifically, said diffusion processes are initiated in the contact materials which form the contact surface and the mounting surface, wherein, within the context of the invention, said contact materials are regarded in each case as part of the component and part of the substrate.

The soldered connection that forms has a diffusion zone which bridges the intermediate space between contact surface and mounting surface. Said diffusion zone is a zone into which the material from the contact materials has diffused, such that a material forms which has an increased melting temperature in relation to the solder material, that is to say the starting material. If the contact materials comprise copper, the diffusion zone may, in the case of a solder material comprising tin, be formed for example by the intermetallic compound of copper and tin. This has a melting point of approximately 420° C., which is considerably higher than that of tin-based solder materials.

The invention also relates to an electronic assembly which has a substrate with a contact surface to which an electronic component is a soldered by way of a mounting surface. The soldered connection has a diffusion zone which bridges the intermediate space between contact surface and mounting surface. Said diffusion zone is formed in the manner already described above. For example, said diffusion zone may be composed of an intermetallic compound. The soldered connection may moreover also have regions which are composed of the solidified solder material. These are normally situated so far remote from the contact surface and from the mounting surface that the contact material cannot encroach from there into said parts of the soldered connection.

BACKGROUND

An electrical assembly and a method for producing the diffusion-soldered connections in an electronic assembly of said type is described for example in DE 10 2012 214 901 A1. It is proposed that so-called semiconductor arrangements, such as for example semiconductor chips, can be fastened by way of a diffusion solder layer to a sintered silver layer. Here, from a silver paste, a sintered silver layer is produced to which the solder is applied. The diffusion soldering process consists in that a diffusion of material between the two layers occurs, whereby a diffusion zone forms. For the purposes of forming the diffusion zone, therefore, it is necessary for different materials to be applied, wherein a diffusion between said solder materials contributes to the formation of the diffusion zone and thus bridges the soldering gap between the components to be soldered.

SUMMARY

One embodiment provides a method for the diffusion soldering of an electronic component to a substrate, in which method the component is placed with its mounting surface onto a contact surface of the substrate, wherein a solder material is used between the substrate and the component, and the solder material is heated to a temperature which initiates a diffusion process between the solder material and the component and the substrate, wherein a soldered connection is formed which has a diffusion zone, which diffusion zone bridges the intermediate space between the contact surface and mounting surface and has an increased melting temperature in relation to the solder material, and wherein the mounting surface of the component and/or the contact surface of the substrate are equipped with depressions which, after the formation of the soldered connection, are situated outside the diffusion zone which bridges the intermediate space between contact surface and mounting surface.

In a further embodiment, the depressions are in the form of channels.

In a further embodiment, the channels surround column-like structural elements, wherein the structural elements form the mounting surface and/or the contact surface.

In a further embodiment, the solder material is provided between the component and the substrate in an amount such that the depressions are completely filled with the solder material.

In a further embodiment, the percentage fraction of the area occupied by the depressions on the mounting surface and/or on the contact surface is locally varied.

In a further embodiment, the percentage fraction of the area occupied by the depressions is selected to be higher at the margin of the mounting surface and/or of the contact surface than in the middle.

In a further embodiment, the percentage fraction of the area occupied by the depressions is selected to be higher in regions of the mounting surface and/or on the contact surface in which increased heat transfer is to be expected than in the regions with relatively low expected heat transfer.

In a further embodiment, the percentage fraction of the area occupied by the depressions in relation to the area occupied by the mounting surface of the component and/or by the contact surface of the substrate is over 50%, e.g., over 70%.

Another embodiment provides an electronic assembly having a substrate with a contact surface to which an electronic component is soldered by way of a mounting surface, wherein the soldered connection has a diffusion zone which bridges the intermediate space between the contact surface and mounting surface and which has an increased melting temperature in relation to the solder material, wherein the mounting surface of the component and/or the contact surface of the substrate are equipped with depressions which are situated outside the diffusion zone which bridges the intermediate space between contact surface and mounting surface.

In a further embodiment, the percentage fraction of the area occupied by the depressions in relation to the area occupied by the mounting surface of the component and/or by the contact surface of the substrate is over 50%, e.g., over 70%.

BRIEF DESCRIPTION OF THE DRAWINGS

Example aspects and embodiments of the invention are described below with reference to the drawings, in which.

DETAILED DESCRIPTION

Embodiments of the invention provide a method for diffusion soldering, and an electronic assembly having at least one diffusion-soldered connection, in which the diffusion-soldered joint which forms can be produced using inexpensive components and with high operational reliability.

Some embodiments provide a method in which the mounting surface of the component and/or the contact surface of the substrate are equipped with depressions which, after the formation of the soldered connection, are situated outside the diffusion zone which bridges the intermediate space between contact surface and mounting surface.

Other embodiments provide an electronic assembly in which the mounting surface of the component and/or the contact surface of the substrate are equipped with depressions which are situated outside the diffusion zone which bridges the intermediate space between contact surface and mounting surface. In other words, the electronic assembly is a product that can be produced by way of the stated method. Where the method features described below relate directly to the structure of the electronics assembly produced, said method features can therefore also be transferred to the electronic assembly.

The disclosed use of depressions in the contact surface and/or in the mounting surface has the advantage that said depressions are available as a buffer space for solder material when the component is placed onto the substrate. Here, it must be taken into consideration that the diffusion zone which, during the formation of the soldered connection, forms at the boundary of the mounting surface and the contact surface with respect to the solder material remains limited to a particular spacing, because the elements composed of the contact material must be present in a certain concentration in the solder material in order that the formation of the diffusion zone occurs, for example through the formation of intermetallic compounds. This however means that, if too large a gap is present, the diffusion zones which form in the soldered connection in each case proceeding from the mounting surface and from the contact surface do not meet. This would have the result that no diffusion zone which bridges the gap would form, though this is of great importance for the mechanical and thermal stability of the soldered connection. This could now be counteracted by virtue of layers with the material provided for the diffusion being produced between those of the solder material, as described in the prior art. However, this is associated with additional manufacturing outlay, which, in accordance with the stated problem, is specifically supposed to be reduced.

On the other hand, it may be difficult for the solder material to be applied so thinly to the joining partners that the gap that arises as a result of the application of solder material is narrow enough that it can be bridged by the diffusion zone which forms. Here, manufacturing tolerances play a role, which tolerances have the effect that such thin layers of solder material would not be evenly thick everywhere, and thus contact would not occur in certain regions. The invention addresses this by virtue of the depressions being provided. In this way, it is made possible for the solder material to be applied in a sufficient thickness, wherein, when the joining partners (component and substrate) are brought together, excess solder material can be displaced into the depressions (this may be assisted through the exertion of a uniaxial joining force in the direction in which the component is placed on). Here, in the region outside the depressions, reliable application of solder material occurs between the contact surface and the mounting surface. Here, the component can be brought so close to the substrate that the resulting joint gap is narrow enough that a diffusion zone which bridges the joint gap (intermediate space) can be formed by way of the soldering process.

The depressions may be provided in the mounting surface or in the contact surface or in both surfaces. In any case, the depressions adjoin the intermediate space that forms the joint gap, and can thus be filled with excess solder material. The mounting surface and contact surface that adjoin said depressions may be of planar form. In this case, the mounting surface and the contact surface can be produced easily, and an intermediate space with a simple geometry advantageously forms. However, it is also possible for the mounting surface and/or the contact surface to be of curved form. In this case, the transition to the depressions may also be smooth. In this case, depressions are situated in the regions where the spacing between the contact surface and the mounting surface is relatively large, whereas the intermediate space which forms the joint gap is present where the spacing between the mounting surface and the contact surface has been reduced to such an extent that it can be bridged by the diffusion zone.

The depressions may be provided so as to be isolated from one another, which has the effect that the mounting surface and/or the contact surface are of coherent form. The depressions may for example be of cup-shaped form. Alternatively, it is also possible for the depressions to form a coherent structure, whereby the mounting surface and/or the contact surface is present in the form of individual, island-like structures.

In order that excess solder material can be reliably displaced into the depressions, it may be provided in some embodiments that the percentage fraction of the area occupied by the depressions in relation to the area occupied by the mounting surface of the component and/or by the contact surface of the substrate is over 50%, e.g., over 70%. The remaining surface, which is provided by the structural elements, is selected to be so large as to still be sufficient to form a mechanically stable diffusion-soldered connection. At the same time, the depressions provide an adequately large volume for receiving excess solder material.

In one embodiment, it is provided that the depressions are in the form of channels. These may surround the area elements of the mounting surface and/or of the contact surface, or may also be arranged in crisscrossing fashion. The depth of the channels determines the amount of solder material that can be received. It should also be noted that the gases which form during the soldering process (owing to the evaporation of, for example, the binding agent of the solder material) can escape via the channels. The channels may surround column-like structural elements, wherein the end faces of the structural elements form the mounting surface or the contact surface for the high-melting connection (diffusion zone). The columns need not necessarily have a circular cross section. They may also be formed with an oval or rectangular cross section. The expression "columns" is thus to be understood in the broadest sense within the context of this invention. The channels need not have a uniform width. They may preferably be arranged linearly, wherein this permits particularly simple manufacture thereof. The channels may however also run in curved fashion, or surround the column-like structural elements.

In one embodiment, the solder material is provided between the component and the substrate in an amount such that the depressions are completely filled with the solder material. Here, a soldered connection is generated which forms bridge-like diffusion zones only in the regions in which the contact surface and the mounting surface form an intermediate space which forms the joint gap. In the region of the depressions which are completely filled by the solder material, conventional soldered connections composed of the solder material form. If such a composite connection is warmed up, for example during the operation of the component, the mechanical strength of the soldered connection is ensured even in the presence of relatively high temperatures owing to the diffusion zones with the increased melting point. This is the case even if those parts of the soldered connection which are formed by the solder alloy soften and would no longer withstand the mechanical demands. The solder material in said regions can however continue to be utilized for the transmission of electrical current, whereby a relatively large line cross section may be made available.

In another embodiment, the percentage fraction of the area occupied by the depressions on the mounting surface and/or on the contact surface is locally varied. This means that, viewed over the entire area, there are regions where the depressions occupy a greater area fraction of the total area locally present there than in other regions. In this way, it is possible for the soldered connection to be adapted to the demands of specific components, as will be discussed in more detail below. For example, in one embodiment, it may be provided that the percentage fraction of the area occupied by the depressions is selected to be higher in regions of the mounting surface and/or on the contact surface in which increased heat transfer is to be expected than in the regions with relatively low expected heat transfer. In this way, by structural means, it can be achieved that, in the regions of increased heat generation of a component, more intense heat dissipation is also possible. This leads to a more uniform temperature profile of the component, which firstly reduces the overall thermal loading of the component and secondly leads to a more uniform thermal expansion behavior. In this way, it is possible for the thermal component loading owing to the absolute heat generation and owing to thermal stresses to be reduced.

In one embodiment, the percentage fraction of the area occupied by the depressions may be selected to be higher at the margin of the mounting surface and/or of the contact surface than in the middle. This embodiment makes it possible for excess solder material, and the gases that arise during the soldering process, to be more easily transported from the middle of the soldered connection to the outside. This may improve the quality of the soldered connection that forms.

Figure 1:
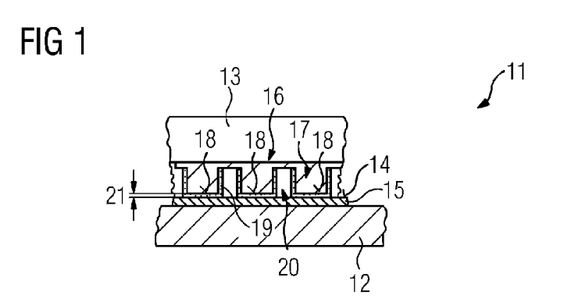
FIG. 1 shows an example embodiment of the electronic assembly according to the invention.

An electronic assembly 11 as per FIG. 1 has a substrate 12 to which an electronic component 13 is fastened. For this purpose, the substrate 12 provides a contact surface 14 which has been structured by way of a metallic coating 15. The component 13 has a mounting side 16 with a metal structure 17, wherein the metal structure 17 provides a mounting surface 18 for a soldered connection. A solder material 19 is provided between the mounting surface 18 and the contact surface 14. The illustration in FIG. 1 thus shows the electronic assembly before the soldering process.

It can also be seen from FIG. 1 that the mounting surface 18 is not connected over the entire area to the contact surface 14 of the substrate. Rather, between regions of the mounting surface 18, there are provided channels 20 which are not completely filled with the solder material 19. Although the solder material extends partially into the channels 20, a provisional connection between the substrate 11 and the component 13 is realized only in the region of the mounting surface 18, where an intermediate space 21 forms which is intended to provide the joint gap for the formation of the diffusion-soldered connection (more in this regard below).

Figure 2:
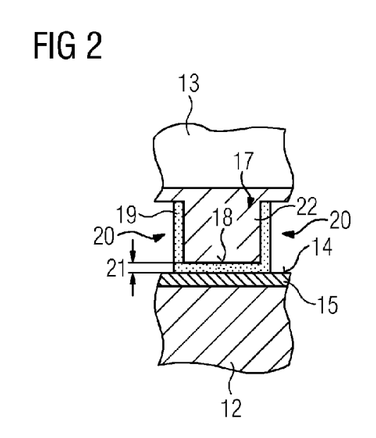
FIGS. 2 to 4 shows selected manufacturing steps of an example embodiment of the disclosed method.

FIG. 2 illustrates a column-like structural element 22 which is surrounded by channels 20 (as illustrated in FIG. 1). Said figure is a detail of an arrangement as shown in FIG. 1. Here, the illustration shows a method stage for the formation of the soldered connection in which the component 13 has just been placed onto the substrate 11.

Figure 3:
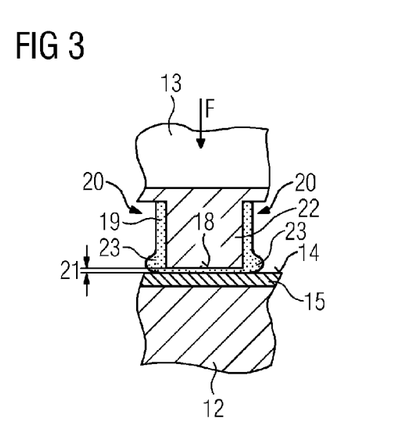

FIG. 3 illustrates the next manufacturing step. A mounting force F is applied to the component 13, which has the effect that the spacing between the component 13 and the substrate 11 is reduced. Here, the intermediate space 21 between the contact surface 14 and the mounting surface 18 is also reduced, with simultaneous formation of the required joint gap. Here, the solder material 19 is partially displaced out of the intermediate space 21 and forms beads in the volume provided by the channels 20.

Figure 4:
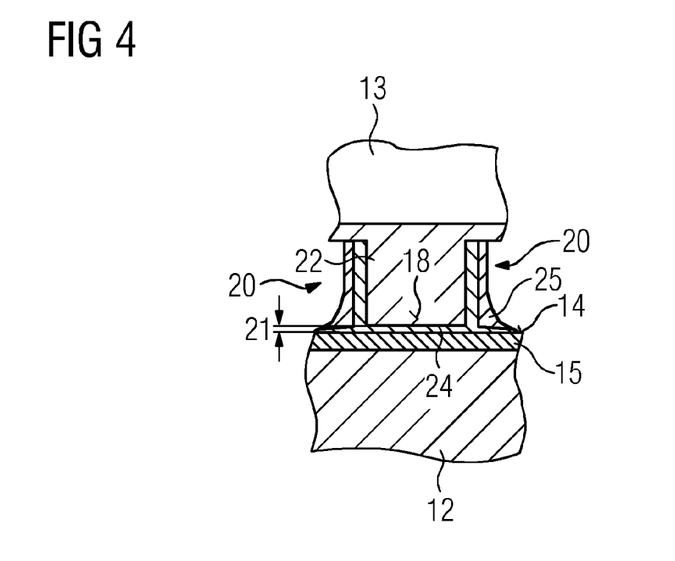

In FIG. 4, the soldering manufacturing step has already been performed, such that a soldered connection has been formed. It can be seen that said soldered connection has, directly adjacent to the contact surface 14 and the mounting surface 18, a diffusion zone 24 which is formed as an intermetallic compound of copper and tin. The copper originates from the metallic coating 15 and the metal structure 17, which are both composed of copper. Tin is provided by the solder material 20. Specifically, said solder material comprises a tin-containing solder, wherein it is possible for standard solder alloys to be used which do not have any particular suitability for diffusion soldering. The solder material may for example be a solder paste, in which the solder alloy, which may be lead-free (for example a tinsilver-copper-based solder alloy), is added in particle form to a binding agent. During the formation of the soldered connection, the solder alloy melts and, as a result of diffusion of copper from the metallic coating and from the metal structure, is changed in terms of its chemical composition at least in the adjoining marginal region such that the intermetallic compound forms in the diffusion zone 24. The intermediate space 21 is so narrow that it is at least partially or entirely bridged by the diffusion zone 24. Here, a thermally highly stable component connection forms, because the melting point of the intermetallic compound is over 400° C. Outside the diffusion zone, it can be seen that a widened soldered connection is formed from the solder alloy 25. This partially fills the channels 20. The solder alloy may also be used for the transmission of the electrical current, because it increases the cross section of the column-like structural element 22.

Figure 5:
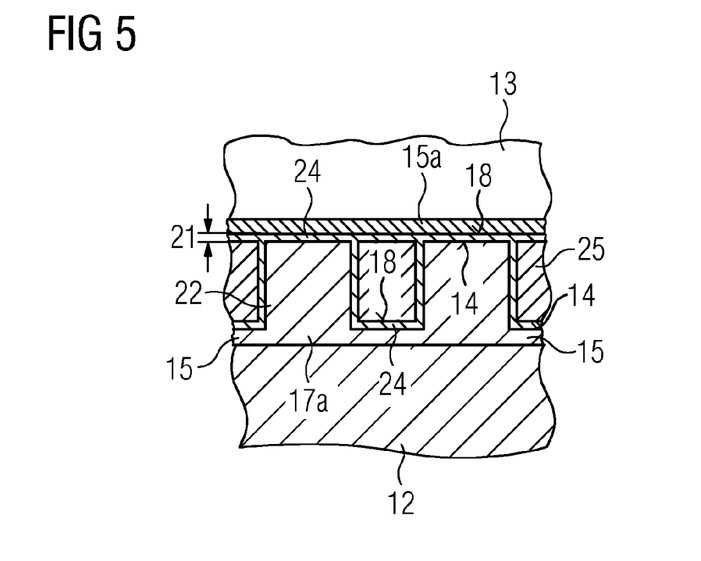
FIG. 5 shows another example of the soldered connection according to another embodiment of the electronic assembly.

FIG. 5 illustrates another structural form of the electrical assembly, as a detail. Said electrical assembly has also already been soldered. The difference lies in the fact that a metal structure 17a is provided not on the component 13 but on the substrate 12. Accordingly, a metallic coating is provided on the component 13. Not illustrated, but likewise conceivable, would be an embodiment in which both joining partners, that is to say the component 13 and the substrate 12, have a metal structure of complementary form. Here, the structural elements would come to lie directly one on top of the other, so as to form the intermediate space. In FIG. 5, however, the intermediate space is formed, in an analogous manner to that illustrated in FIGS. 1 to 4, by the contact surface 14 and the mounting surface 18.

A further difference in relation to FIGS. 1 to 4 lies in the fact that the channels are completely filled with the solder alloy 25. This is achieved in that the joining partners or one of the joining partners is provided with solder material (cf. FIG. 1) in an amount sufficient to provide that, when the mounting force F is applied as per FIG. 3, the beads 23 that are formed completely fill the channels. Thus, after the formation of the soldered connection, a relatively large cross section for conducting the electrical current is made available, because the solder alloy 25 is likewise available for conducting the electrical current. The mechanical stability of the soldered connection is ensured by way of the diffusion zone 24 formed in the intermediate space 21.

FIGS. 6 to 9 illustrate plan views of the contact surface 14 or of the mounting surface 18. This is dependent on whether the electrical component 13 as per FIG. 1 or the substrate 12 as per FIG. 5 bears the metal structure. Since these however do not differ structurally in both cases, it is possible for in each case one illustration to be used for both situations.

Figure 6:
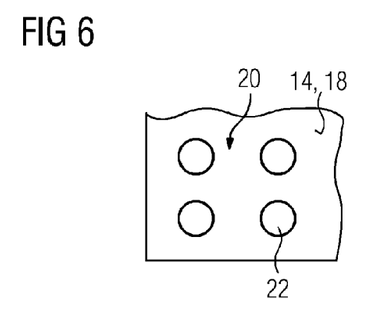
FIGS. 6 to 10 show plan views of different distributions of depressions on joining surfaces and/or contact surfaces, according to example embodiments.

FIG. 6 illustrates the column-like structural elements 22 as per FIGS. 1 to 5 in a plan view. It is clear that the channels are formed by intermediate spaces surrounding the column-like structural elements 22.

Figure 7:
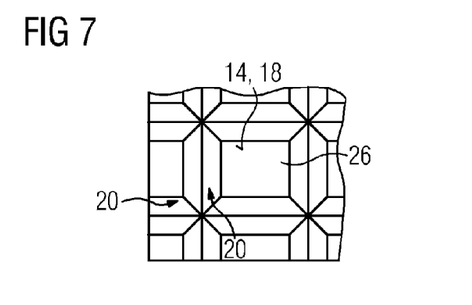

In FIG. 7, the channels 20 are in the form of V-shaped channels, wherein the edges hereby formed can be seen in FIG. 7. Channels 20 are provided which intersect at right angles, wherein this has the result that truncated pyramids 26 are formed as structural elements. The respective upper delimiting surface of the truncated pyramids 26 forms the contact surface 14 or the mounting surface 18.

Figure 8:
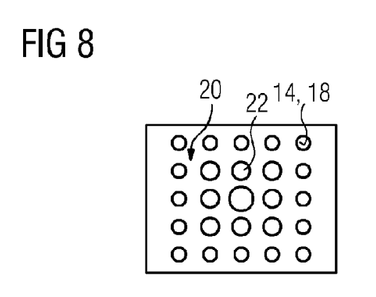

In FIG. 8, similarly to FIG. 6, column-like structural elements are illustrated which likewise have a circular cross section. The respective end faces form the contact surface 14 or the mounting surface 18, as in FIG. 6. By contrast to FIG. 6, the diameters of the column-like structural elements 22 differ, specifically such that the diameter becomes smaller toward the margin of the group of structural elements 22. In this way, given constant columns spacings, the volume of the channels 20 surrounding the structural elements 22 becomes greater toward the margin, whereby the discharge of excess solder material is made easier. Such a structural form is therefore particularly suitable for a soldered connection as per FIG. 5, where the channels 20 are to be completely filled with the solder alloy 25.

Figure 9:
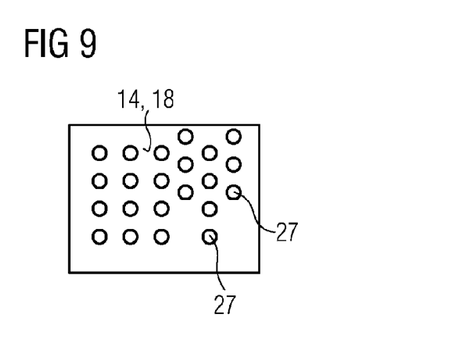

In FIG. 9, the contact surface 14 or the mounting surface 18 is of coherent form, with cup-like depressions 27 being formed therein. It can also be seen in FIG. 9 that said cup-like depressions 27 are provided in different densities. In the upper right-hand corner in FIG. 9, the depressions are arranged with a doubled density. This is a region in which only a small amount of heat is introduced into the soldered connection by the component adjoining the soldered connection that is formed. Therefore, in said region, relatively low heat dissipation is advantageous in order that the component is not distorted as a result of a locally varying heating action.

Figure 10:
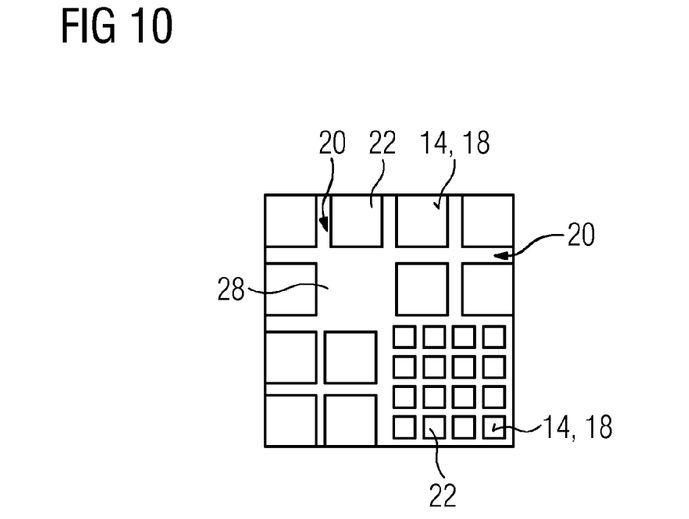

FIG. 10 shows column-like structural elements 22 which have a square cross section. These are separated from one another by channels 20 with a flat channel base. It can also be seen in FIG. 10 that the contact surface 14 or mounting surface 18 provided per unit area is only half as large in the lower right-hand corner in FIG. 10 as in the remaining region, because twice as many of the crisscrossing channels 22 are arranged there. Furthermore, in FIG. 10, it is also possible to see an additional reservoir 28 in which no column-like structural element 22 is provided, such that a relatively large cavity for receiving solder material is formed. Such reservoirs may be provided in particular if the mounting surface 18 or contact surface 14 is particularly large, such that excess solder material cannot be readily transported to the margin of said surface.

Figure 11:
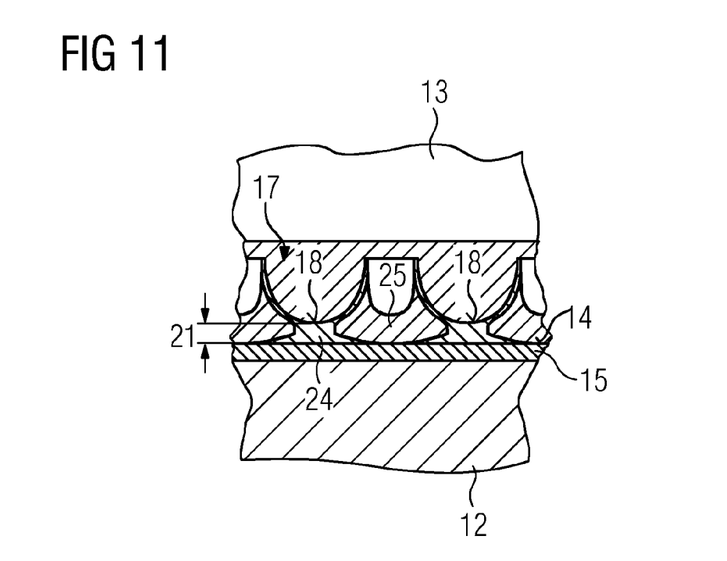
FIG. 11 shows a section view of an example embodiment of a soldered connection.

FIG. 11 shows an alternative construction of structural elements 29 which are part of the metal structure 17. These are of stud-like form, such that there is no edge which defines the margins of the mounting surface 18. The mounting surface 18 is rather defined by the dimensions of the diffusion zone in the region bridged by the intermediate space 21. When the spacing between the joining partners increases to such an extent that it can no longer be bridged by the diffusion zone 24, the depression in which the solder alloy 25 at least partially forms starts there.

What is claimed is:
1. A method for the diffusion soldering of an electronic component to a substrate, the method comprising:
   arranging a mounting surface of the electronic component adjacent a contact surface of the substrate, with a solder material arranged between the mounting surface of the electronic component and the contact surface of the substrate; and
   heating the solder material to a temperature that initiates a diffusion of the solder material between the electronic component and the substrate, to thereby form a soldered connection having a diffusion zone that (a) bridges an intermediate space between the mounting surface and the contact surface, (b) has an increased melting temperature in relation to the solder material, and (c) comprises chemical elements diffused from the component and chemical elements diffused out of the substrate into the soldered connection;
   wherein at least one of the mounting surface of the electronic component or the contact surface of the substrate include depressions located outside the dif- fusion zone that bridges the intermediate space between the mounting surface and the contact surface; and wherein the depressions located outside the diffusion zone are partially filled by extended solder connections providing transmission of electrical current.

2. The method of claim 1, wherein the depressions comprise channels.

3. The method of claim 2, wherein the channels surround column-shaped structural elements that define at least one of the mounting surface or the contact surface.

4. The method of claim 1, wherein the diffusion of the solder material between the electronic component and the substrate completely fills the depressions with the diffusion zone.

5. The method of claim 1, wherein a fraction of area occupied by the depressions on the mounting surface or the contact surface varies locally.

6. The method of claim 5, wherein the fraction of the area occupied by the depressions is higher at an outer region of the mounting surface or contact surface than in a middle region of the mounting surface or contact surface.

7. The method of claim 5, wherein the fraction of area occupied by the depressions is higher in regions of the mounting surface or contact surface having a concentration of expected heat generation from the electronic component than in other regions.

8. The method of claim 1, wherein over 50% of the mounting surface or contact surface is occupied by the depressions.

9. The method of claim 1, wherein over 70% of the mounting surface or contact surface is occupied by the depressions.

* * * * *